US008704536B2

(12) United States Patent
Duden

(10) Patent No.: US 8,704,536 B2
(45) Date of Patent: Apr. 22, 2014

(54) LATERAL DISPLACEMENT AND ROTATIONAL DISPLACEMENT SENSOR

(75) Inventor: Thomas Duden, Kensington, CA (US)

(73) Assignee: The Regents of the University of California, Oakland, CA (US)

(*) Notice: Subject to any disclaimer, the term of this patent is extended or adjusted under 35 U.S.C. 154(b) by 452 days.

(21) Appl. No.: 13/002,762

(22) PCT Filed: Jul. 28, 2009

(86) PCT No.: PCT/US2009/051988
§ 371 (c)(1),
(2), (4) Date: Apr. 8, 2011

(87) PCT Pub. No.: WO2010/017065
PCT Pub. Date: Feb. 11, 2010

(65) Prior Publication Data
US 2011/0175629 A1 Jul. 21, 2011

Related U.S. Application Data

(60) Provisional application No. 61/086,061, filed on Aug. 4, 2008.

(51) Int. Cl.
G01R 27/26 (2006.01)
(52) U.S. Cl.
USPC ............................ 324/658; 324/661; 324/686
(58) Field of Classification Search
None
See application file for complete search history.

(56) References Cited

U.S. PATENT DOCUMENTS

| 4,429,307 | A |   | 1/1984 | Fortescue |
| 5,479,191 | A |   | 12/1995 | Komatsu |
| 5,736,865 | A |   | 4/1998 | Nelson et al. |
| 5,872,408 | A |   | 2/1999 | Rakov |
| 6,388,262 | B1 |   | 5/2002 | Alani et al. |
| 6,492,911 | B1 | * | 12/2002 | Netzer ..................... 340/870.37 |
| 7,884,326 | B2 |   | 2/2011 | van de Water et al. |
| 2007/0180924 | A1 | * | 8/2007 | Warren et al. ................... 73/780 |
| 2011/0174972 | A1 |   | 7/2011 | Duden |

FOREIGN PATENT DOCUMENTS

| EP | 1 058 095 | 12/2000 |
| JP | 08327310 A * | 12/1996 ............... G01B 7/30 |

OTHER PUBLICATIONS

U.S. Appl. No. 12/968,024, "Apparatus and methods for controlling electron microscope stages", Thomas Duden, filed Dec. 14, 2010.
Engineeringtalk, The Engineer, Products and services for engineers, "Absolute rotary position sensing with zero wear, a RDP Electronics product story", Engineeringtalk editorial team, Feb. 17, 2000.
Manning, Bryan et al., "A high-precision noncontact electronic gap measurement gauge", Capacitec, 2002.
"Capacitec CMS-3™, Capacitive Measurement System for hole diameter measurement", 2005.
"Capacitec Non-contact displacement standard products", 1998.
AZoNanotechnology, "Queensgate Instruments", Dec. 9, 2005.

(Continued)

Primary Examiner — Minh N Tang
(74) Attorney, Agent, or Firm — Lawrence Berkeley; National Laboratory

(57) ABSTRACT

A position measuring sensor formed from opposing sets of capacitor plates measures both rotational displacement and lateral displacement from the changes in capacitances as overlapping areas of capacitors change. Capacitances are measured by a measuring circuit. The measured capacitances are provided to a calculating circuit that performs calculations to obtain angular and lateral displacement from the capacitances measured by the measuring circuit.

19 Claims, 7 Drawing Sheets

(56) References Cited

OTHER PUBLICATIONS

PI Piezo—Nano—Positioning, "Capacitive displacement sensors—nanometrology Solutions", Jun. 2007.
M H W Bonse, F Zhu, and H F van Beek, Meas. Sci. Technol. 4 (1993) 801-807.
H G Xu et al., 2006, J. Micromech. Microeng., 16, 2747.
Moojin Kima, Wonkyu Moona, Euisung Yoonb, Kwang-Ryeol Lee, Sensors and Actuators A: Physical, vols. 130-131, Aug. 14, 2006, pp. 135-141.
Extended European Search Report for EP Patent Application No. 09805368.9, mailed Dec. 20, 2011.

* cited by examiner

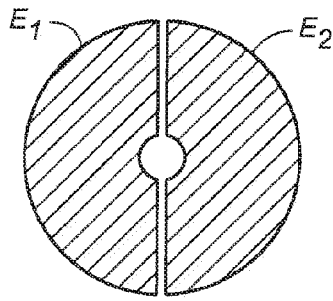
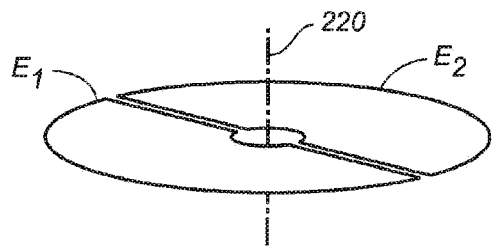
FIG. 2A     FIG. 2B
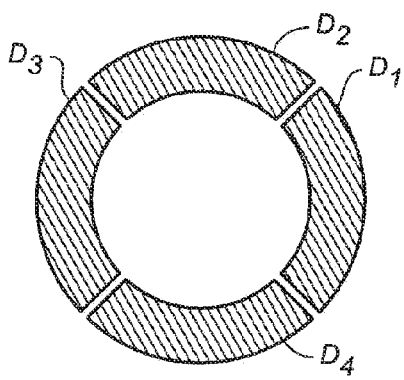
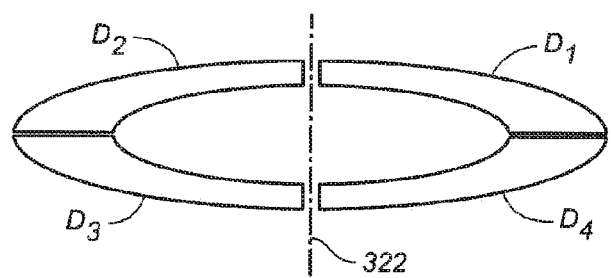
FIG. 3A     FIG. 3B
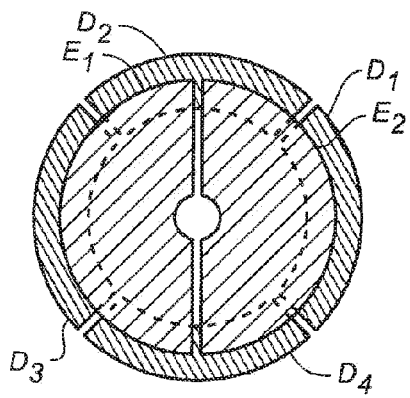
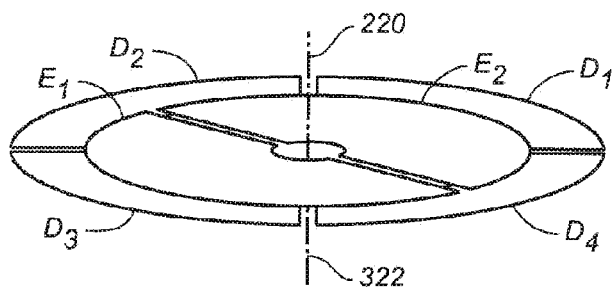
FIG. 4A     FIG. 4B

LATERAL DISPLACEMENT AND ROTATIONAL DISPLACEMENT SENSOR

CROSS REFERENCE TO RELATED APPLICATIONS

This application claims priority to U.S. Patent Application No. 61/086,061 entitled: "Capacitance Displacement and Rotation Sensor" filed on Aug. 4, 2008, which is hereby incorporated by reference in its entirety and for all purposes.

STATEMENT OF GOVERNMENT INTEREST

This invention was made in the course of or under prime contract No. DE-AC02-05CH11231 between the U.S. Department of Energy and the University of California. The Government has certain rights to this invention.

BACKGROUND

This invention relates to sensors for determining the position of an object, in particular determining the object's lateral displacement and rotational orientation, using capacitance.

Positional sensors have various applications in today's world. In some applications, a very accurate measurement of position is needed over a limited range. One example of such an application is in manipulation of a stage of a high resolution microscope such as an electron microscope. Electron microscopes include Scanning Electron Microscopes (SEMs), Transmission Electron Microscopes (TEMs), Scanning Transmission Electron Microscopes (STEMs) and various kinds of Reflection and Emission Electron Microscopes like the Low Energy Electron Microscope (LEEM) and Photoemission electron Microscope (PEEM). Such microscopes have much higher resolution than optical microscopes and therefore require manipulation of a stage with very high precision. The location of the specimen stage is generally measured as it is moved so that when a feature is found, its location may be recorded and the microscope may return to the feature if desired. In addition to measuring the location of the stage, the angle of tilt of the stage with respect to the electron beam illumination has to be measured to align the objective lens properly. Thus, the position of the stage may include location in three translational and two angular degrees of freedom of the stage.

Optical encoders may be used to measure the position of an electron microscope stage. Even though modern optical encoders overcome the light wavelength limit by interpolation and can measure down to a few nm displacement, the direct measurement of displacement is only possible within the periodicity of the ruler used, typically a few um. When the displacement is larger, a counter for the traversed ruler periods is necessary. The counter can get out of synchronization with the ruler, which usually means that the experiment has to be terminated and a run to a special reference mark has to be made. Other mechanisms may be used to measure position. However, the environment of an electron microscope presents problems for many techniques. In particular, techniques based on magnetic fields (e.g. a linear differential transformer) may be susceptible to interference from stray magnetic fields created by an electron microscope, or may influence the performance of the microscope by its own stray field.

SUMMARY

A position measuring sensor formed from opposing sets of capacitor plates measures both rotational displacement and lateral displacement from the changes in capacitances as overlapping areas of the capacitors change. In one example, two moving capacitor plates are provided that can be excited together, or individually, and four stationary capacitor plates are provided so that their capacitive coupling to the two excited capacitor plates can be measured. Both sets of plates have rotational symmetry in this example. Capacitances are measured by a measuring circuit. The measured capacitances are provided to a calculating circuit that performs calculations to obtain angular and lateral displacement from the capacitances measured by the measuring circuit. Such a position measuring sensor may be used in a stage assembly or aperture assembly of an electron microscope.

An electron microscope stage assembly according to an embodiment includes: a plurality of moving capacitor plates attached to a moving portion of the stage assembly; a plurality of stationary capacitor plates attached to a stationary portion of the stage assembly; a measuring circuit that individually measures capacitances between the plurality of moving capacitor plates and the plurality of stationary capacitor plates; and a calculating circuit that receives the measured capacitances from the measuring circuit and calculates displacement of the moving portion relative to the stationary portion.

A position sensing system according to an embodiment includes: a first capacitor plate and a second capacitor plate disposed symmetrically about a first axis, the first and second capacitor plates attached to a first body; four or more opposing capacitor plates, opposed to the first and second capacitor plates, the four or more capacitor plates disposed symmetrically about a second axis, the four or more capacitor plates attached to a second body; a measuring circuit that measures capacitances between the first capacitor plate and individual ones of the four or more capacitor plates, and measures capacitances between the second capacitor plate and individual ones of the four or more capacitor plates; and a calculating circuit that calculates relative linear displacement and angular displacement of the first body relative to the second body from the measured capacitances.

A method of obtaining linear and angular displacement of a first object relative to a second object according to an embodiment includes: providing first and second plates that are rigidly attached to the first object, the first and second plates disposed symmetrically about a first axis; providing four or more opposing plates that are rigidly attached to the second object, the four or more opposing plates disposed symmetrically about a second axis; measuring capacitances between the first plate and individual ones of the opposing plates, and between the second plate and individual ones of the opposing plates; and from the measured capacitances deriving linear displacement of the first axis from the second axis and angular displacement of the first object about the first axis.

BRIEF DESCRIPTION OF THE DRAWINGS

The invention may best be understood by reference to the following description taken in conjunction with the accompanying drawings, which illustrate specific embodiments of the present invention.

FIG. 2A shows capacitor plates E1, E2.

FIG. 2B shows an alternative view of capacitor plates E1, E2.

FIG. 3A shows capacitor plates D1-D4.

FIG. 3B shows an alternative view of capacitor plates D1-D4.

FIG. 4A shows capacitor plates E1, E2 coupled to capacitor plates D1-D4.

FIG. 4B shows an alternative view of capacitor plates E1, E2, coupled to capacitor plates D1-D4.

DETAILED DESCRIPTION OF ILLUSTRATED EMBODIMENTS

Figure 1A:
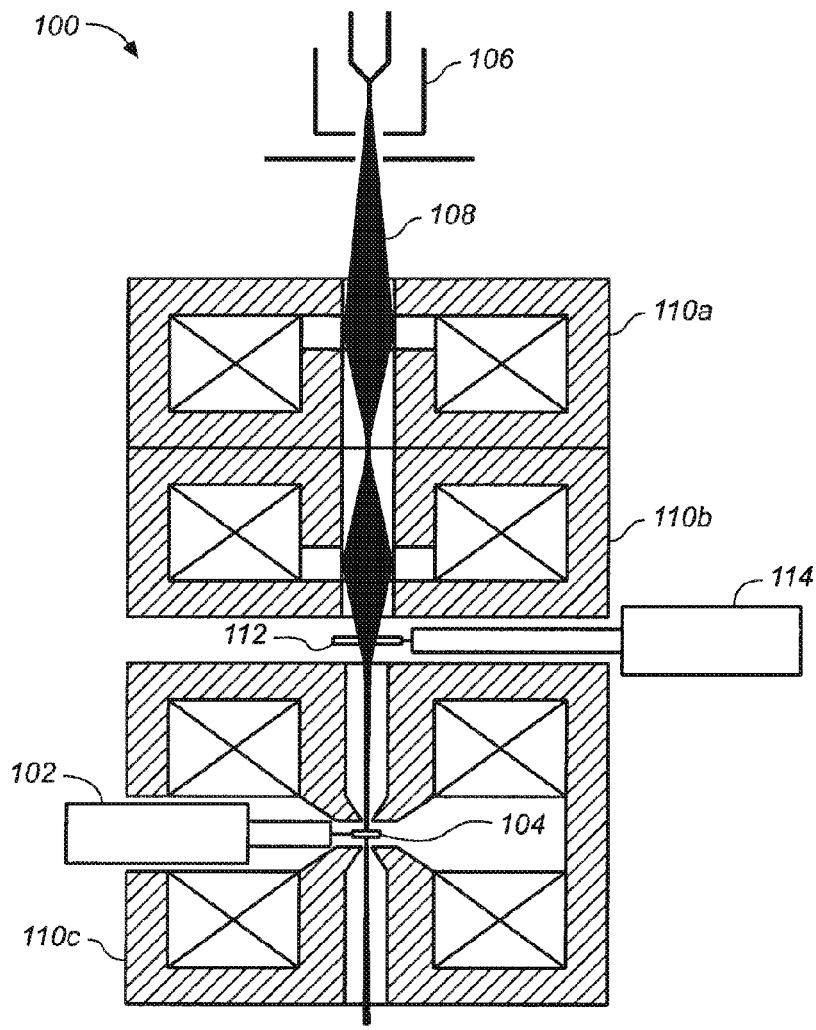
FIG. 1A shows an electron microscope stage and an aperture that are movable with respect to an electron beam.

FIG. 1A shows a transmission electron microscope 100 that includes a stage assembly 102 for holding a sample 104 that is being examined by the electron microscope 100. An electron gun 106 generates an electron beam 108, which is then focused by lenses 110a-c on an area of stage 104, which holds the sample. Electrons from the sample are collected by an electron collector or transmitted into the imaging optical system and are used to generate an image of the area of the sample being examined. In addition to passing through lenses 110a-c, electron beam 108 may pass through one or more apertures, such as aperture 112. Aperture 112 is manipulated by aperture assembly 114, which contains one or more actuators and position sensors.

Figure 1B:
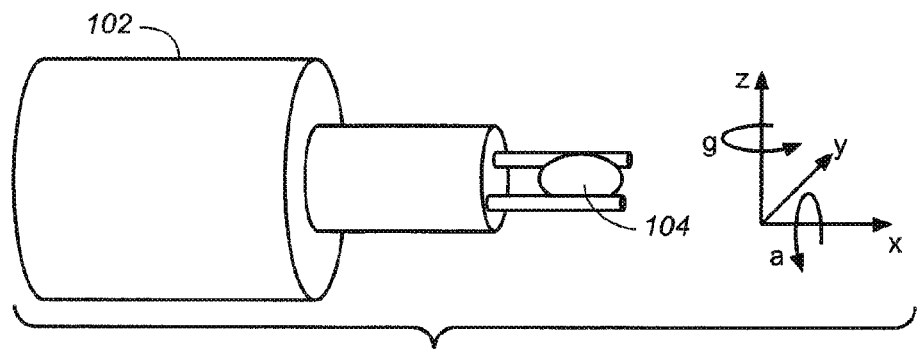
FIG. 1B shows a more detailed view of the stage assembly of FIG. 1A.

It is generally important to be able to measure the position of the sample so that locations of objects of interest can be recorded and a user can return to view such features after moving to another area. Also, the angle of tilt of the stage (angle between the electron beam and the sample) is important and has to be routinely adjusted when the objective lens is aligned. In particular, where the sample has a crystalline structure, the orientation of a crystal axis with respect to the electron beam may be critical to obtain a good result. FIG. 1B shows a more detailed view of stage assembly 102. Stage assembly 102 contains actuators to move stage 104 and also contains a displacement sensor to measure both lateral and rotational (angular) displacement of the stage with respect to some stationary portions of the stage assembly. FIG. 1B shows X, Y and Z axes indicating possible lateral displacement of stage 104. Rotational displacement of stage 104 may also occur about X and Z axes as shown. Examples of stage assemblies are described in more detail in U.S. patent application Ser. No. 11/861,721, filed Sep. 26, 2007, entitled, "Manipulator for rotating and translating a sample holder," and in U.S. Pat. No. 6,388,262.

Aperture assembly 114 may have a similar structure to stage assembly 102, and contains an aperture drive or aperture manipulator to move aperture 112. Knowing the exact position of aperture 112 may be critical. Such apertures (there may be multiple apertures along an electron beam in an electron microscope) may be changed regularly depending on the present use or optimization of the electron beam. If the positions of such apertures are known precisely, the apertures can be returned to a prior position with little or no need for further adjustment or alignment. A similar apparatus may be used for sensing position of a stage in a stage assembly or an aperture in an aperture assembly of an electron microscope.

According to an embodiment of the present invention, a position sensor uses capacitance to measure position. In particular, lateral displacement and rotational displacement may be measured by a single sensor that includes multiple capacitors that vary in capacitance as the stage is moved.

A capacitor is formed by two opposing plates (or electrodes) that are separated by a dielectric (which may be an air gap, or vacuum). The capacitance of a capacitor is related to the area of the plates, the distance between them, and the dielectric between the plates. The relationship is given by the well-known equation:

$$C = \frac{\varepsilon A}{d}$$

where $\varepsilon$ is the dielectric constant of the material between the plates, d is the distance separating the plates, and A is the area that couples the plates. In a fixed capacitor, all three values are constant, providing a constant capacitance. In a variable capacitor (such as commonly used to tune radios) the area coupling the plates is varied. This is generally done by moving one capacitor plate laterally (along the plane of the plate) with respect to the other capacitor plate. Such capacitor plates may be formed of multiple fins to provide increased coupling area. Even though the areas of the individual plates themselves (generally metal plates) are fixed, the coupling area changes and thus the capacitance changes. The change of capacitance as capacitor plates move with respect to each other is used in examples here to provide an indication of position.

It should be noted that some sensors use a change in distance between capacitor plates as an indicator of pressure, or other environmental factors. Such sensors are different in operation because of the limited range of variation in such distance, and the limitation that the distance between two plates only indicates positional change along one direction and is not easily incorporated into a sensor that measures positional change in more than one direction. In the following examples, the distance between capacitor plates remains constant and only the coupling area is varied. Environmental factors acting on the dielectric, like e.g. humidity of the atmospheric air are excluded by the vacuum of the electron microscope.

In an electron microscope stage assembly, the stage itself (which holds the sample being examined) and some portions connected to the stage are generally movable with respect to the remainder of the stage assembly, which may be considered stationary (or static). The stationary portions may be bolted or otherwise rigidly attached to a frame or base that does not move when the electron microscope is in use. Actuators (such as electric motors) connect the movable portions to the stationary portions and effect movement of the stage. In examples described here, movable capacitor plates are coupled to a movable portion of the stage assembly, while stationary (or fixed) capacitor plates are coupled to a stationary portion of the stage assembly. The capacitors thus formed by opposing plates are variable capacitors that vary as the movable portion moves with respect to the stationary portion. By choosing plates of suitable geometry, both lateral movement and rotational movement may be measured. An aperture assembly may be similarly formed of movable and stationary portions, with capacitor plates attached to each to form variable capacitors.

According to an embodiment, a sensor is formed by opposing sets of capacitor plates, each set centered about a different axis. FIGS. 2A and 2B show two views (top-view and three-dimensional view respectively) of a first set of capacitor plates. The first set of capacitor plates consists of two capacitor plates E1 and E2, each defined by an equal sized sector of a circle centered on a first axis 220. Capacitor plates E1, E2 are symmetric about first axis 220. In this example, capacitor plates E1, E2 each extend over a little less than 180 degrees, with a small gap between them. In other examples, capacitor plates may extend over some other angular range. In other examples, the projected gap between the plates may be zero when the plates are stacked into different planes.

There is a central opening about the axis 220 so that capacitor plates E1, E2 do not occupy their entire sectors in this example. The size of the central opening (if any) is not critical. Capacitor plates E1, E2 may be formed on a surface of an object, or otherwise rigidly attached to an object. In this example, capacitor plates E1, E2 are attached to a moving portion of the sensor, which in turn is rigidly connected to a moving portion of the electron microscope assembly. Thus, capacitor plates E1, E2 may be considered to be moving capacitor plates.

FIGS. 3A and 3B show two views (top-view and three-dimensional view respectively) of a second set of capacitor plates. The second set of capacitor plates consists of four capacitor plates D1-D4, each defined by a sector of a circle that is centered on a second axis 322. Capacitor plates D1-D4 are symmetric about second axis 322. In this example, each capacitor plate is defined by a sector that extends over a little less than 90 degrees with small gaps between capacitor plates D1-D4. Such sectors may be considered as quadrants. There is a central opening about second axis 322 so that capacitor plates D1-D4 do not occupy entire sectors. The size of the central opening is a design parameter that is chosen to provide a significant change in capacitances between the first set of capacitor plates and the second set of capacitor plates as relative motion occurs, while maintaining some overlap between capacitor plates at all times. Capacitor plates D1-D4 may be formed on a surface of an object or otherwise rigidly attached to an object. In this example, capacitor plates D1-D4 are attached to a stationary portion of the sensor, which in turn is rigidly connected to a stationary portion of the electron microscope assembly. Thus, capacitor plates D1-D4 may be considered to be stationary capacitor plates.

FIGS. 4A and 4B show two views (top-view and three-dimensional view respectively) of the first and second sets of capacitor plates capacitively coupled together. Capacitive coupling occurs between the first capacitor plates and second capacitor plates where the first set of capacitor plates overlie the second set of capacitor plates. In this view first axis 220 and second axis 322 extend along the same line so that the first capacitor plates and the second capacitor plates are aligned. This may be considered a home position or zero position for lateral displacement, the position from which lateral displacement is measured. FIG. 4B shows a gap between the first and second capacitor plates that in this example is simply an air gap. First and second capacitor plates may be mounted so that they are maintained a constant distance apart. Suitable circuits are attached to the first and second sets of capacitor plates to allow measurement of each capacitor formed, and these capacitances are in turn used to calculate the position of the first set of plates with respect to the second set of plates.

Figure 5A:
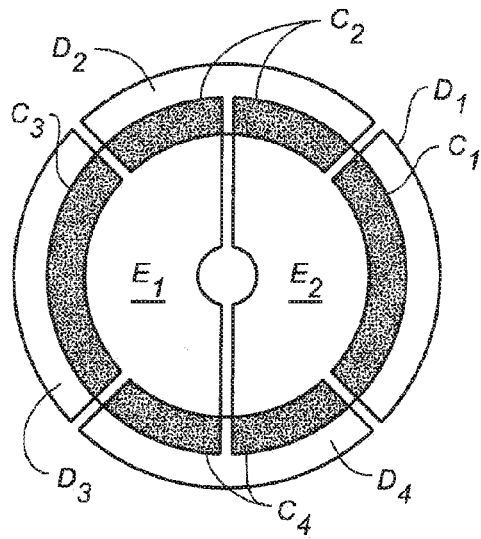
FIG. 5A shows capacitors formed by capacitor plates E1, E2 where they overlie capacitor plates D1-D4.
Figure 5B:
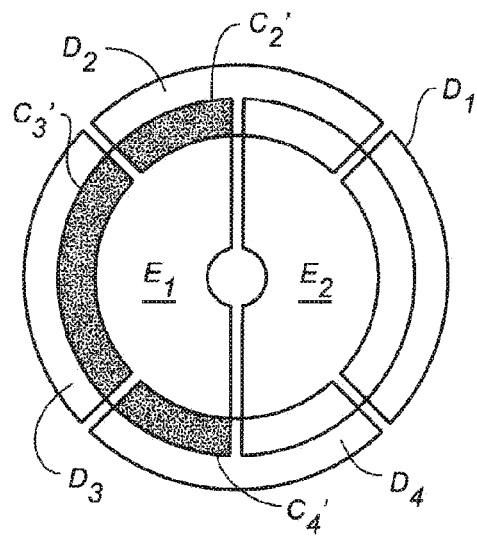
FIG. 5B shows capacitors formed by capacitor plate E1 where it overlies capacitor plates D2-D4.

FIGS. 5A-5B show the individual capacitors formed by the first and second capacitor plates in a position where there is no lateral displacement (i.e. first and second axes extend along the same line). In particular, FIG. 5A shows capacitors C1-C4 (shaded), which are formed by capacitor plates E1, E2 where they overlie capacitor plates D1-D4. In this example, capacitor plates E1, E2 are excited, while capacitor plates D1-D4 are connected to measurement circuits that measure capacitances. Thus, capacitor plates D1-D4 are considered to be detector plates in this example. It should be noted that different capacitor plates may be excited, or used as detector plates, at different times. Use as either exciter or detector plate does not imply a different physical capacitor plate design or a permanent difference in configuration. In the present example, the moving plates are exciting plates and the stationary plates are detector plates. However, this may be reversed in other examples, or the same plates may be used as both exciters and detectors in different modes. In the example shown in FIG. 5A, both capacitor plates E1, E2 are excited together and act as a single capacitor plate. Capacitors C1-C4 are formed by capacitor plates E1, E2, and D1-D4 as follows:

| $E_1 + E_2$ and $D_1$ | $E_1 + E_2$ and $D_2$ | $E_1 + E_2$ and $D_3$ | $E_1 + E_2$ and $D_4$ |
|---|---|---|---|
| $C_1$ | $C_2$ | $C_3$ | $C_4$ |

FIG. 5B shows capacitors $C_2'$-$C_4'$ formed by capacitor plate E1 in combination with capacitor plates D2-D4. The capacitances of these capacitors may be measured by exciting only capacitor plate E1 (without exciting capacitor plate E2), while measuring capacitances using detector plates D1-D4. Because capacitor plate E1 does not overlap capacitor plate D1 in FIG. 5B, no capacitor is formed between these two plates. However, with a different rotational displacement, capacitor plate E1 may overlie capacitor plate D1, thereby forming a capacitor $C_1'$. Thus, a complete list of capacitors that may be formed between capacitor plate E1, and detector plates D1-D4 is as follows:

| $E_1$ and $D_1$ | $E_1$ and $D_2$ | $E_1$ and $D_3$ | $E_1$ and $D_4$ |
|---|---|---|---|
| $C_1'$ | $C_2'$ | $C_3'$ | $C_4'$ |

Figure 5C:
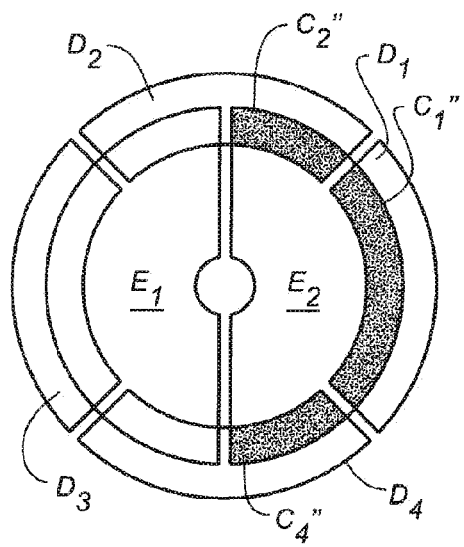
FIG. 5C shows capacitors formed by capacitor plate E2 where it overlies capacitor plates D1, D2, and D4.

FIG. 5C shows capacitors $C_1''$, $C_2''$, and $C_4''$ formed by capacitor plate E2 in combination with capacitor plates D1, D2, D4. The capacitances of these capacitors may be measured by exciting only capacitor plate E2 (without exciting capacitor plate E1), while measuring capacitances using detector plates D1-D4. Because capacitor plate E2 does not overlap capacitor plate D3 in FIG. 5C, no capacitor is formed between these two plates. However, with a different rotational displacement, capacitor plate E2 may overlie capacitor plate D3, thereby forming a capacitor $C_3''$. Thus, a complete list of capacitors that may be formed between capacitor plate E2 and detector plates D1-D4 is as follows:

| $E_2$ and $D_1$ | $E_2$ and $D_2$ | $E_2$ and $D_3$ | $E_2$ and $D_4$ |
|---|---|---|---|
| $C_1''$ | $C_2''$ | $C_3''$ | $C_4''$ |

In addition to the three modes of operation shown in FIGS. 5A-5C, which excite both capacitor plates together, only capacitor plate E1, and only capacitor plate E2 respectively, additional modes may excite the two plates in opposition. For example, if capacitor plate E1 is excited in phase, with capacitor plate E2 excited in antiphase, the following capacitances may be measured:

| $E_1 - E_2$ and $D_1$ | $E_1 - E_2$ and $D_2$ | $E_1 - E_2$ and $D_3$ | $E_1 - E_2$ and $D_4$ |
|---|---|---|---|
| $C_1' - C_1''$ | $C_2' - C_2''$ | $C_3' - C_3''$ | $C_4' - C_4''$ |

In another example, if capacitor plate E1 is excited in antiphase and capacitor plate E2 is excited in phase, the following capacitances may be measured:

| $-E_1 + E_2$ and $D_1$ | $-E_1 + E_2$ and $D_2$ | $-E_1 + E_2$ and $D_3$ | $-E_1 + E_2$ and $D_4$ |
|---|---|---|---|
| $-C_1' + C_1''$ | $-C_2' + C_2''$ | $-C_3' + C_3''$ | $-C_4' + C_4''$ |

To determine the lateral and rotational displacement of the moving capacitor plates E1, E2 with respect to the stationary capacitor plates D1-D4, the above described capacitances may be used in a number of different ways. It can be seen that as capacitor plates E1, E2 move with respect to capacitor plates D1-D4, the capacitances of the capacitors formed change in a manner that is dependent upon both lateral displacement and rotational displacement. In some cases, separate estimates of displacement may be obtained from different capacitances and averaged, or otherwise combined, to provide a more accurate result. Thus, while particular techniques of calculating rotational displacement and lateral displacement are described here, the present invention is not limited by such examples.

Angular Displacement

Figure 6A:
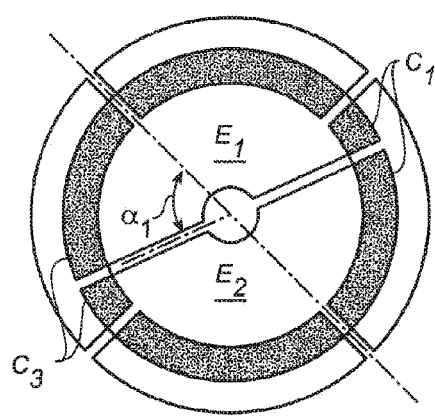
FIG. 6A shows capacitors formed by capacitor plates E1, E2 where they overlie capacitor plates D1-D4 with an angular displacement from a zero position.

FIGS. 6A-6D show changing capacitances as rotation occurs. FIG. 6A shows capacitors formed when the first set of plates have an angular displacement $\alpha_1$ from a particular position, which may be considered a home position, or zero position, from which angular displacement is measured. In particular, FIG. 6A shows capacitors C1 and C3, which are formed by the combined capacitor plates E1, E2 with capacitor plates D1 and D3 respectively. In this example, C1 and C3 are equal because the moving capacitor plates E1, E2 are centered over stationary capacitor plates D1-D4. However, as can be seen, each of capacitors C1, C3 is made up of unequal parts, and the relative sizes of these parts is an indicator of angular displacement as may be seen in FIGS. 6B-6C.

Figure 6B:
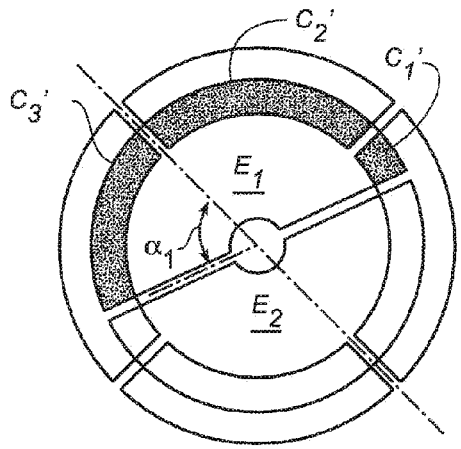
FIG. 6B shows capacitors formed by capacitor plate E1 where it overlies capacitor plates D1-D3 with an angular displacement from a zero position.
Figure 6C:
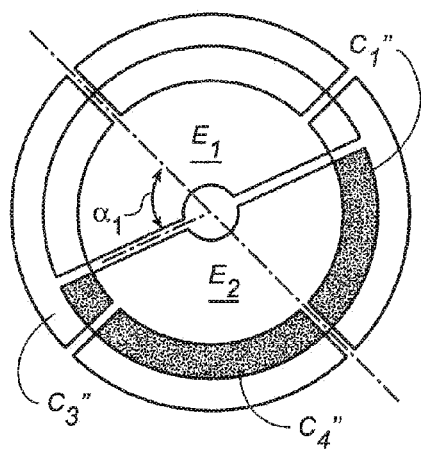
FIG. 6C shows capacitors formed by capacitor plate E2 where it overlies capacitor plates D1, D3, and D4 with an angular displacement from a zero position.

FIG. 6B shows capacitors C1'-C3', which are measured by exciting capacitor plate E1, without exciting capacitor plate E2. FIG. 6C shows capacitors $C_1''$, $C_3''$, and $C_4''$, which are measured by exciting capacitor plate E2, without exciting capacitor plate E1. The angular displacement $\alpha_1$ may be calculated from these measured capacitances according to the following formula:

$$\alpha_1 = \frac{\pi}{2} \cdot \frac{1}{2} \cdot \left( \frac{C_1''}{C_1} \frac{C_1}{(C_1 + C_3)} + \frac{C_3'}{C_3} \frac{C_3}{(C_1 + C_3)} \right)$$

This formula is simply the angle $\pi/2$ subtended by capacitor plates D1, D2, multiplied by a weighted average of C1''/C1 and C3'/C3, which are each fractions that are proportional to $\alpha_1$. While C1''/C1 and C3'/C3 are equal in this example, weighting factors C1/(C1+C3) and C3/(C1+C3) provide additional weighting that corrects for some lateral displacement of the capacitor plates E1, E2, which may cause C1''/C1 and C3'/C3 to be unequal.

The above formula may be simplified to:

$$\alpha_1 = \frac{\pi}{4} \frac{(C_1'' + C_3')}{(C_1 + C_3)}$$

While capacitor plates D1, D3 allow measurement over a range of angular displacement of 90 degrees (or $\pi/2$ radians), it can be seen that if $\alpha_1$ increases beyond this angle, C1''/C1 and C3'/C3 are both equal to one, and remain at 1 for the next 90 degrees. Capacitor plates D2, D4 may be used to obtain angular displacement over this angular range in a similar manner.

Figure 6D:
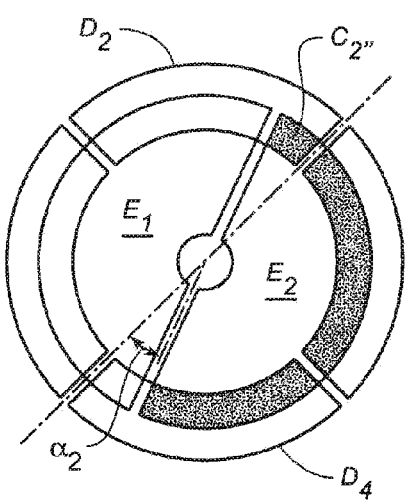
FIG. 6D shows capacitors formed by capacitor plate E2 where it overlies capacitor plates D1, D2, and D4 with a different angular displacement.

FIG. 6D shows a second angle $\alpha_2$ that may be measured using capacitor plates D2, D4. In particular, it may be seen that C2'' is proportional to $\alpha_2$, and that C4' (not shown in FIG. 6D) is similarly proportional to $\alpha_2$. Thus, $\alpha_2$ may be calculated from the formula:

$$\alpha_2 = \frac{\pi}{4} \frac{(C_2'' + C_4')}{(C_2 + C_4)}$$

Figure 7:
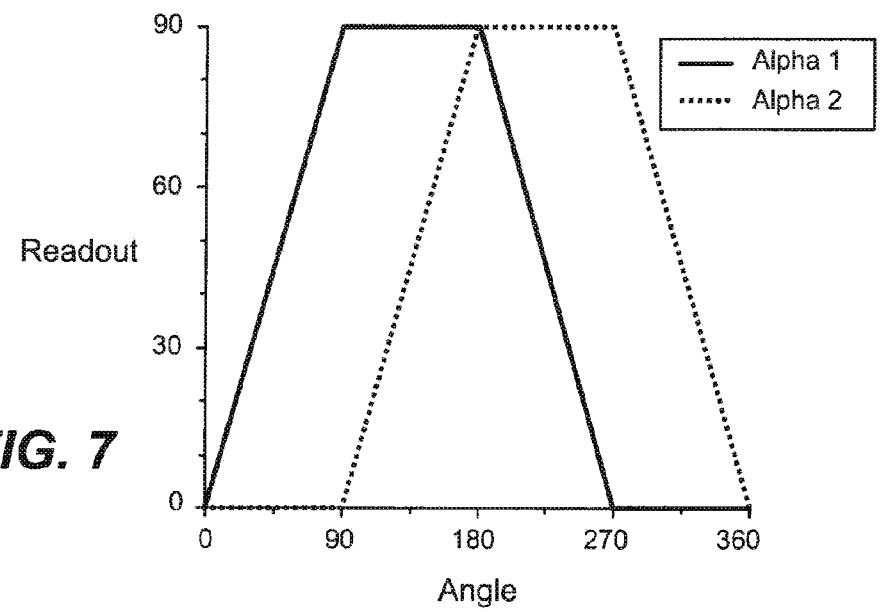
FIG. 7 shows angular values calculated from capacitance measurement as a function of actual angular displacement.

From the two angles $\alpha_1$, $\alpha_2$, the angular displacement of capacitor plates E1, E2 with respect to capacitor plates D1-D4 may be obtained over the entire range of angular displacement (0-360 degrees). FIG. 7 shows plots of $\alpha_1$ (Alpha 1), and $\alpha_2$ (Alpha 2), with angular displacement of capacitor plates D1, D2 from a zero position where $\alpha_1=0$. As can be seen, $\alpha_1$ gives an indicator of angular displacement from 0-90 degrees and again from 180 degrees to 270 degrees, with $\alpha_2$ giving an indication of angular displacement in the other two quadrants.

Averaging and calculating the angular parameter as described above reduces crosstalk between position variations and angular readout. The exact value depends on the diameters and radii used. The residual nonlinearities can be resolved by, for example, using a lookup table in software for post-detection compensation.

The formulae and processing power needed to evaluate angular displacement can be modified to make use of antiphase excitation, by making maximum use of a differential acquisition mode of an electronic system, thereby eliminating common mode disturbances that affect all input parameters, as thermal drift, either electronic or mechanical.

Figure 8:
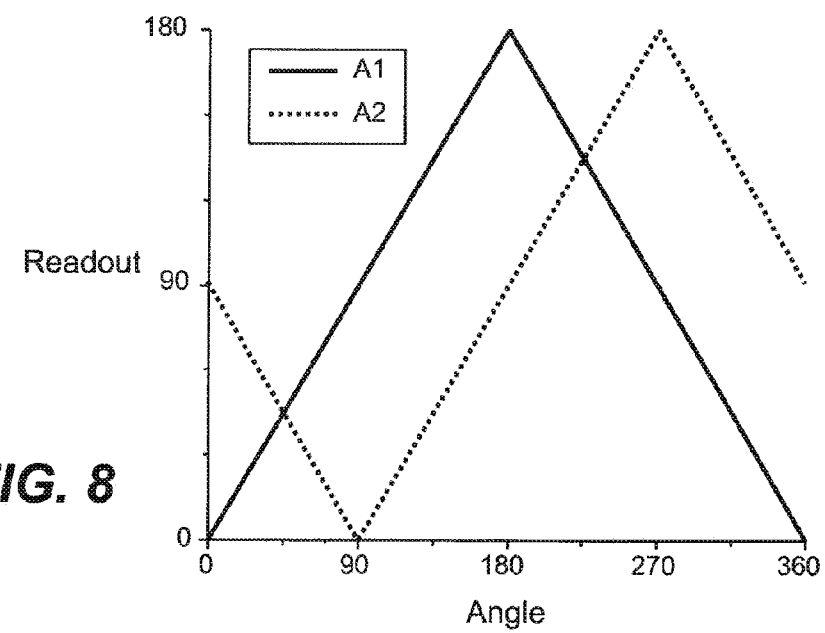
FIG. 8 shows quadrature signals generated from the calculated angular values of FIG. 7.

In one example, factors A1, and A2 are calculated from the values of $\alpha_1$, and $\alpha_2$ obtained by measurement, and are used as quadrature signals. Here, $A1=\alpha_1+\alpha_2$; and $A2=90°-\alpha_1+\alpha_2$. FIG. 8 shows plotted values for A1 and A2 as functions of angular displacement. One possible routine for providing an output $\alpha$ that represents angular displacement is as follows:

```
if (A1 < 90)
{
    if (A2 < 90)
        α = (sin⁴(α₁) * α₁ + sin⁴(α₂) * (90 – α₂) ) / (sin⁴(α₁) + sin⁴(α₂));
    else
        α= (sin⁴(α₁) * (180 – α₁) + + sin⁴(α₂) * (450 – α₂) ) / (sin⁴(α₁) +
           sin⁴(α₂));
}
else
{
    if (A2 < 90)
        α = (sin⁴(α₁) * α₁ + sin⁴(α₂)* (90 + α₂)) / (sin⁴(α₁) + sin⁴(α₂));
    else
        α = (sin⁴(α₁) * (360 – α₁) + sin⁴(α₂)* (90 + α₂)) / (sin⁴(α₁) +
           sin⁴(α₂));
}
```

Where $\alpha$ is the angle delivered as readout from the sensor. By utilizing the weighting with the $\sin^4$ coefficients, imprecision stemming from the signals A1 and A2 close to zero and 180 degrees are suppressed.

Lateral Displacement

In addition to measuring angular displacement as described above, a capacitive sensor may be used to measure lateral displacement. Thus, the same sensor provides information regarding both angular displacement and lateral displacement, providing a simple, space-efficient and cost-effective way to determine the position of an object.

Figure 9:
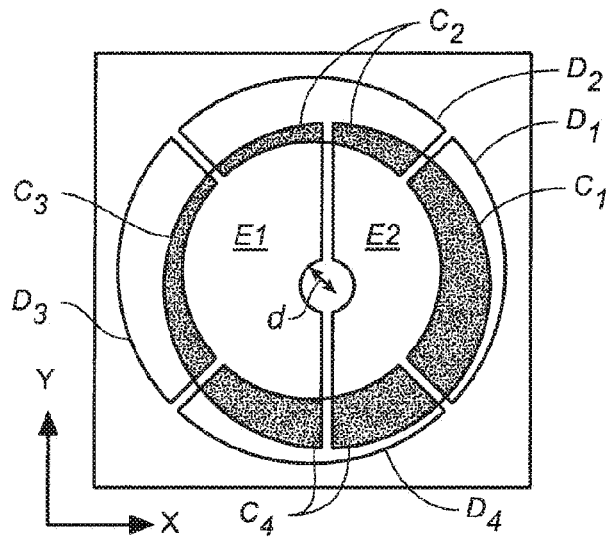
FIG. 9 shows capacitors formed between capacitor plates E1, E2 and capacitor plates D1-D4 with some lateral displacement.

FIG. 9 shows an example where capacitor plates E1, E2 are displaced a distance d, with displacement in both X and Y directions. A good approximation for lateral displacement in both X and Y directions may be obtained from the following formulae:

$$X=L_{X'}(C_1-C_3)$$

$$Y=L_{Y'}(C_2-C_4)$$

Where the coefficients $L_X$, $L_Y$ are scale factors that may be found by calibrating on a test jig. In one example, a suitable electronic circuit may be connected to the capacitor plates so that capacitance differences are measured, and these may be used to provide X and Y displacement from the above formulae.

Figure 10:
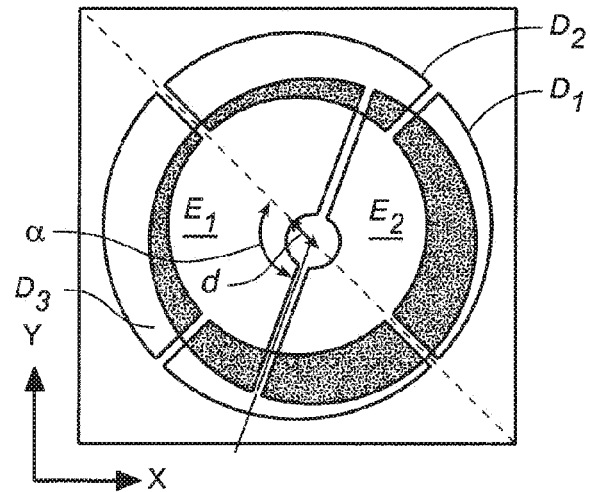
FIG. 10 shows capacitors formed between capacitor plates E1, E2 and capacitor plates D1-D4 with both angular and lateral displacement.

FIG. 10 shows both lateral displacement d and angular displacement $\alpha$. In particular, FIG. 10 shows capacitor plates E1 and E2, both excited together, thus providing values for C1-C4, which may be used to estimate lateral displacement in both X and Y directions. Capacitor plates E1, E2 may also be individually excited providing capacitance values from which rotational displacement may be calculated as described above. Thus, by measuring capacitances between capacitor plates as shown, angular displacement and lateral displacement may both be calculated from a single sensor.

Figure 11:
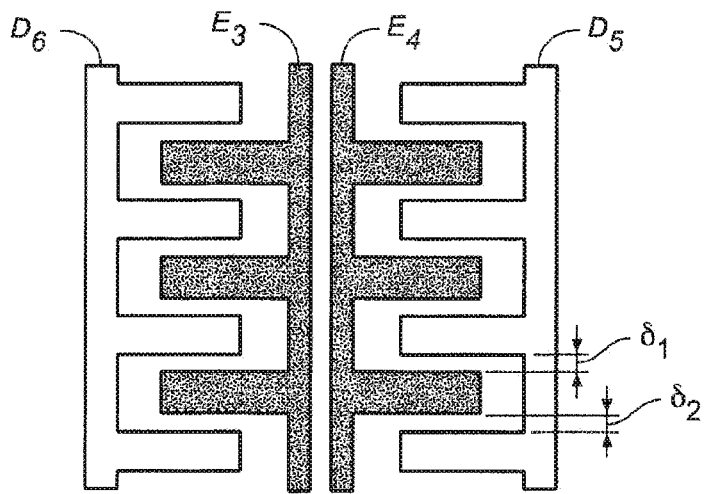
FIG. 11 shows a cross sectional view of capacitor plates that include multiple fins, which are coupled to opposing fins.

In an example, opposing sets of capacitor plates are formed as a stack of alternating fins that provide a large surface area to couple capacitor plates and provide a high tolerance to misalignment of parts. Such a stack may look the same as FIG. 10 in end-view (view along axis of rotation) but is different in cross section. FIG. 11 shows a cross sectional view of a capacitive sensor according to such an embodiment. In particular, FIG. 11 shows two excited capacitor plates E3 and E4, which are coupled to detecting capacitor plates D5 and D6. Here, unlike prior examples, capacitor plates are defined by cylinders instead of being defined by circles. Thus, capacitor plates E3 and E4 are defined by one cylinder, while capacitor plates D5 and D6 are defined by a larger cylinder, so that plates E3 and E4 have some room to move within plates D5 and D6. It will be understood that D5 and D6 are just two of four stationary capacitor plates in the present example, with the other two stationary capacitor plates not visible in this view. Each of the four stationary capacitor plates occupies sectors of the cylinder defining the stationary capacitor plates. The gaps $\delta 1$ and $\delta 2$ between an individual fin of capacitor plate E4 and adjacent fins of capacitor plate D5 are shown in FIG. 11. If there is some misalignment that causes gap $\delta 1$ to be reduced to less than its designed value, this is compensated for by a corresponding increase in gap $\delta 2$, thus maintaining the total capacitance between E4 and D5 at its designed value, thereby providing a high tolerance for misalignment between moving and stationary capacitor plates. It should be noted that, while the above examples show an axis of rotation that is vertical, when used in an electron microscope, the axis of rotation for which angular displacement is measured may not be vertical. In one application, the angular displacement that is measured is the angle of tilt of an electron microscope stage with respect to an electron beam. Such an angle of tilt is an angle about a horizontal axis.

Figure 12:
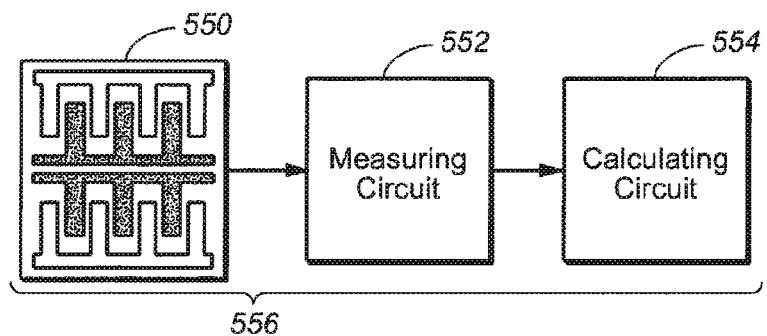
FIG. 12 shows a system for measuring lateral and rotational displacement using a capacitive sensor.

FIG. 12 shows how a sensor according to any of the above embodiments may be incorporated into a position sensing system. In particular, FIG. 12 shows a capacitive sensor 550 that is connected to a measuring circuit 552. Measuring circuit 552 may be an appropriate circuit such as a circuit formed on a Printed Circuit Board (PCB) or an Integrated Circuit (IC). In an example, the measuring circuit is an integrated charge-to-digital converter with a noise suppressing synchronous detection scheme that provides appropriate signals to excite certain capacitor plates and sense other capacitor plates so that all necessary capacitances are measured directly by the IC. A calculating circuit 554 is connected to the measuring circuit 552. Sensor 550, measuring circuit 552, and calculating circuit 554 together form position sensing system 556. Calculating circuit 554 may be any suitable circuit. In an example, the calculating circuit is a general purpose microprocessor IC which is programmed to perform certain calculations, such as those described above, and to output angular and lateral displacement values based on the calculations performed. In another example, the measuring circuit and calculating circuit may be formed in the same IC or same PCB.

Figure 13:
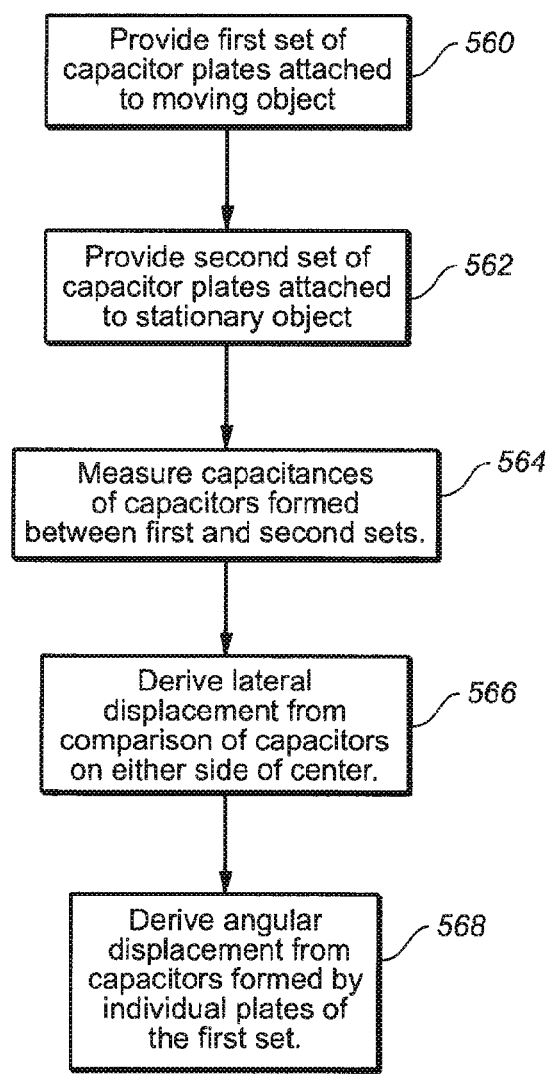
FIG. 13 is a flowchart showing a method of obtaining lateral and angular displacement.

FIG. 13 shows a flowchart for a method of obtaining linear and angular displacement of a moving object with respect to a stationary object. A first set of capacitor plates are provided so that they are rigidly attached to a moving object 560. A second set of capacitor plates are provided so that they are rigidly attached to a stationary object 562. Each set of capacitor plates may be centered about its respective central axis. The first and second sets of plates are located so that capacitors are formed where they overlie. The capacitances of the capacitors thus formed are measured 564 using any suitable measurement circuit. From these measurements, lateral displacement of the moving object with respect to the stationary object is derived from differences in capacitances on either side of a central axis 566. Angular displacement is derived from different capacitances formed by individual capacitor plates of the first (moving) set of capacitor plates 568.

A sensor according to the above examples may be used to map features on a particular sample, creating a zero point, and allowing position tagging of features with respect to the zero point. For example, the zero point may be a location where the capacitances are balanced (i.e. C1=C3, and C2=C4 in the above examples). Any position of interest may be tagged so that the capacitance values when the microscope is centered on that position are recorded. This allows the microscope to return to the position at a later time. In this way, a series of features may be position tagged over a relatively large area and subsequently the microscope may return to any of these features rapidly so that further investigation may be performed. Position tagging may record not only the location of the feature on the sample, but also record a particular angular displacement that provides a good viewing angle. This may be particularly important for crystalline structures.

While examples of the present invention described above relate to specific applications in electron microscopes, the present invention has many other applications and is not limited to electron microscopes. For example, a sensor according to an embodiment of the present invention may be used to provide accurate position information regarding a photonic crystal used in a holographic data storage device. Another application is in precision machine tools, for example tools that use lasers for laser ablation, where the laser, or a stage, may be moved with high precision and may benefit from accurate position measurement. Another application is in Hard Disk Drives (HDDs) where the position of read/write heads may be measured with high precision. Aspects of the present invention may find various applications in optical systems. For example, sensing the positions of elements (such as lenses or the sample) in an optical confocal microscope, or in a laser deflection strain measurement system. Other optical applications include position sensing in a fiber optical switch or a fiber coupler. While these are examples of applications of the present invention, this is not an exhaustive list, and other applications are also within the scope of the present invention.

All patents, patent applications, articles, books, specifications, other publications, documents and things referenced herein are hereby incorporated herein by this reference in their entirety for all purposes. To the extent of any inconsistency or conflict in the definition or use of a term between any of the incorporated publications, documents or things and the text of the present document, the definition or use of the term in the present document shall prevail.

Although the various aspects of the present invention have been described with respect to certain preferred embodiments, it is understood that the invention is entitled to protection within the full scope of the appended claims.

What is claimed is:

1. An electron microscope stage assembly comprising:
a first moving capacitor plate and a second moving capacitor plate disposed symmetrically about a first axis, the first and second moving capacitor plates attached to a moving portion of the stage assembly, the stage assembly being coupled to an electron microscope stage;
four or more stationary capacitor plates, opposed to the first and second moving capacitor plates, the four or more stationary capacitor plates disposed symmetrically about a second axis, the four or more stationary capacitor plates attached to a stationary portion of the stage assembly;
a measuring circuit configured to measure capacitances between the first moving capacitor plate and the four or more stationary capacitor plates, and configured to measure capacitances between the second moving capacitor plate and the four or more stationary capacitor plates; and
a calculating circuit configured to receive the measured capacitances from the measuring circuit and configured to calculate displacement of the moving portion relative to the stationary portion.

2. The electron microscope stage assembly of claim 1 wherein the calculating circuit is configured to calculate rotational displacement of the moving portion relative to the stationary portion.

3. The electron microscope stage assembly of claim 1 wherein the calculating circuit is configured to calculate lateral displacement of the moving portion relative to the stationary portion.

4. The electron microscope stage assembly of claim 1 wherein the first and second moving capacitor plates are defined by equal sized sectors of a first circle that is centered on a first axis.

5. The electron microscope stage assembly of claim 4 wherein the four or more stationary capacitor plates are defined by equal sized sectors of a second circle that is centered on a second axis.

6. A position sensing system comprising:
a first capacitor plate and a second capacitor plate disposed symmetrically about a first axis, the first and second capacitor plates attached to a first body;
four or more capacitor plates, opposed to the first and second capacitor plates, the four or more capacitor plates disposed symmetrically about a second axis, the four or more capacitor plates attached to a second body;
a measuring circuit configured to measure capacitances between the first capacitor plate and individual ones of the four or more capacitor plates, and configured to measure capacitances between the second capacitor plate and individual ones of the four or more capacitor plates; and
a calculating circuit configured to calculate relative linear displacement and angular displacement of the first body relative to the second body from the measured capacitances.

7. The position sensing system of claim 6 wherein the position sensing system is coupled to an electron microscope stage and the first axis is an axis of tilt of the electron microscope stage.

8. The position sensing system of claim 7 wherein the first body is rigidly attached to the electron microscope stage and is configured to move with the electron microscope stage and the second body is a stationary body and is configured not to move with the electron microscope stage.

9. The position sensing system of claim 6 wherein the measuring circuit is configured to provide an electrical excitation signal to the first and second plates and is configured to measure resulting signals from individual ones of the four or more capacitor plates.

10. The position sensing system of claim 6 wherein the first capacitor plate and the second capacitor plate are defined by sectors of a first circle centered on the first axis.

11. The position sensing system of claim 10 wherein the four or more capacitor plates are defined by sectors of a second circle centered on the second axis.

12. The position sensing system of claim 6 wherein the first and second capacitor plates are defined by a first cylinder centered on the first axis, the first and second capacitor plates individually including two or more fins at different locations along the first axis.

13. The position sensing system of claim 12 wherein the four or more capacitor plates are defined by a second cylinder centered on the second axis, the four or more capacitor plates individually including two or more fins at different locations along the second axis, such that fins of the four or more capacitor plates extend between fins of the first and second capacitor plates.

14. The position sensing system of claim 6 wherein the position sensing system is coupled to an aperture in an electron microscope.

15. A method of obtaining linear and angular displacement of a first object relative to a second object comprising:
providing first and second plates that are rigidly attached to the first object, the first and second plates disposed symmetrically about a first axis;
providing four or more opposing plates that are rigidly attached to the second object, the four or more opposing plates disposed symmetrically about a second axis;
measuring capacitances between the first plate and individual ones of the four or more opposing plates, and between the second plate and individual ones of the opposing plates; and
from the measured capacitances deriving linear displacement of the first axis from the second axis and angular displacement of the first object about the first axis.

16. The method of claim 15 wherein first object is a movable portion of an electron microscope stage assembly and the second object is a fixed portion of the electron microscope stage assembly.

17. The method of claim 16 wherein the first axis is an axis of tilt of the electron microscope stage assembly.

18. The method of claim 15 wherein the measuring capacitances operation includes:
providing an electrical excitation signal to the first and second plates; and
measuring a resulting signal from individual ones of the four or more opposing plates.

19. The method of claim 15 wherein the first object is a movable portion of an electron microscope aperture assembly and the second object is a fixed portion of the electron microscope aperture assembly.

* * * * *